United States Patent
Przybysz et al.

(10) Patent No.: US 7,328,299 B2
(45) Date of Patent: Feb. 5, 2008

(54) INTERFACE FOR COMPRESSED DATA TRANSFER BETWEEN HOST SYSTEM AND PARALLEL DATA PROCESSING SYSTEM

(75) Inventors: Alison A. Przybysz, Columbia, MD (US); Daniel S. Cohen, Baltimore, MD (US)

(73) Assignee: Atmel Corporation, San Jose, CA (US)

( * ) Notice: Subject to any disclaimer, the term of this patent is extended or adjusted under 35 U.S.C. 154(b) by 181 days.

(21) Appl. No.: 10/995,696

(22) Filed: Nov. 23, 2004

(65) Prior Publication Data
US 2006/0112293 A1 May 25, 2006

(51) Int. Cl.
G06F 13/40 (2006.01)
G06F 13/38 (2006.01)
G06F 13/20 (2006.01)

(52) U.S. Cl. .................... 710/307; 710/66
(58) Field of Classification Search .......... 710/66, 710/307
See application file for complete search history.

(56) References Cited

U.S. PATENT DOCUMENTS

| | | | | |
|---|---|---|---|---|
| 4,280,221 A * | 7/1981 | Chun et al. | ............ | 375/288 |
| 4,680,733 A | 7/1987 | Duforestel et al. | ......... | 364/900 |
| 5,193,093 A | 3/1993 | Okazaki | | |
| 5,247,657 A | 9/1993 | Myers | ............ | 395/550 |
| 5,274,763 A * | 12/1993 | Banks | ............ | 710/316 |
| 5,321,400 A | 6/1994 | Sasaki et al. | ............ | 341/100 |
| 5,613,078 A * | 3/1997 | Kishigami | ............ | 710/307 |
| 5,686,913 A | 11/1997 | Coln et al. | ............ | 341/51 |
| 5,835,752 A * | 11/1998 | Chiang et al. | ............ | 713/400 |
| 5,845,107 A * | 12/1998 | Fisch et al. | ............ | 710/315 |
| 6,510,483 B1 * | 1/2003 | Rezeanu et al. | ............ | 710/307 |
| 6,542,096 B2 | 4/2003 | Chan et al. | ............ | 341/100 |
| 2002/0101367 A1 | 8/2002 | Geiger et al. | ............ | 341/51 |
| 2003/0200359 A1 | 10/2003 | Fernald | ............ | 710/5 |

OTHER PUBLICATIONS

Ddeepika, "The Serial Peripheral Interface", an article found on the World Wide Web dated Jan. 7, 2001 at http://www.geocities.com/ddeepika/spi, 3 pages.

* cited by examiner

Primary Examiner—Paul R. Myers
Assistant Examiner—Ryan M Stiglic
(74) Attorney, Agent, or Firm—Schneck & Schneck; Thomas Schneck

(57) ABSTRACT

An apparatus and method for interfacing a host system having a system data bus, clock signals, and control signals to a parallel data bus is described. Setting configuration bits allows the interface apparatus to be programmed to operate as a transmitter or a receiver with selectable device interface modes. When operating as a transmitter, the interface apparatus combines and compresses the system data bus, clocks, and control signals to match the available width of the parallel data bus. When operating as a receiver, the interface receives signals from the parallel data bus and restores the original signals which were combined and compressed. The device interface modes are selectable to be compatible in different device and circuit configurations.

19 Claims, 8 Drawing Sheets

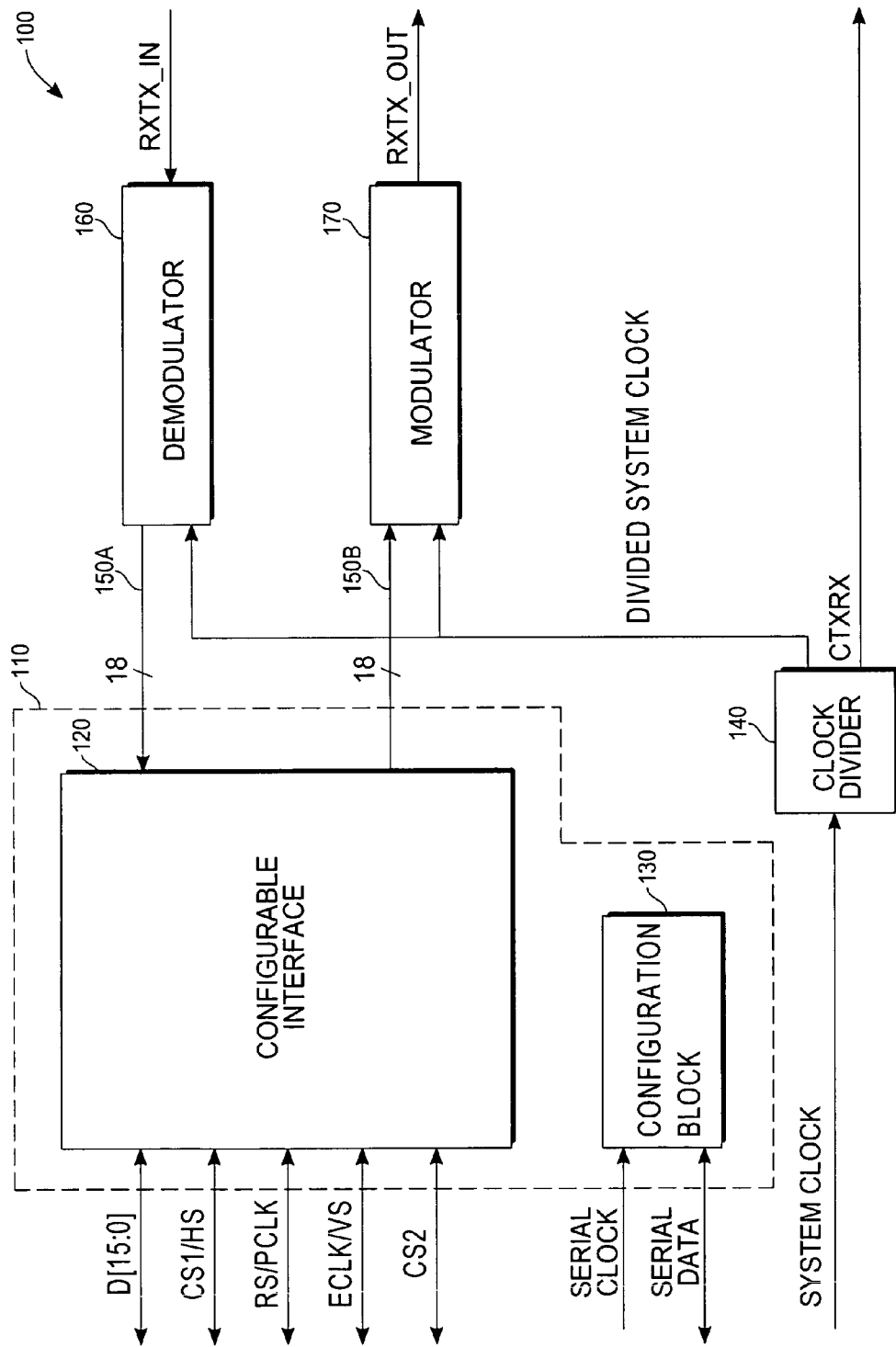
Fig._1

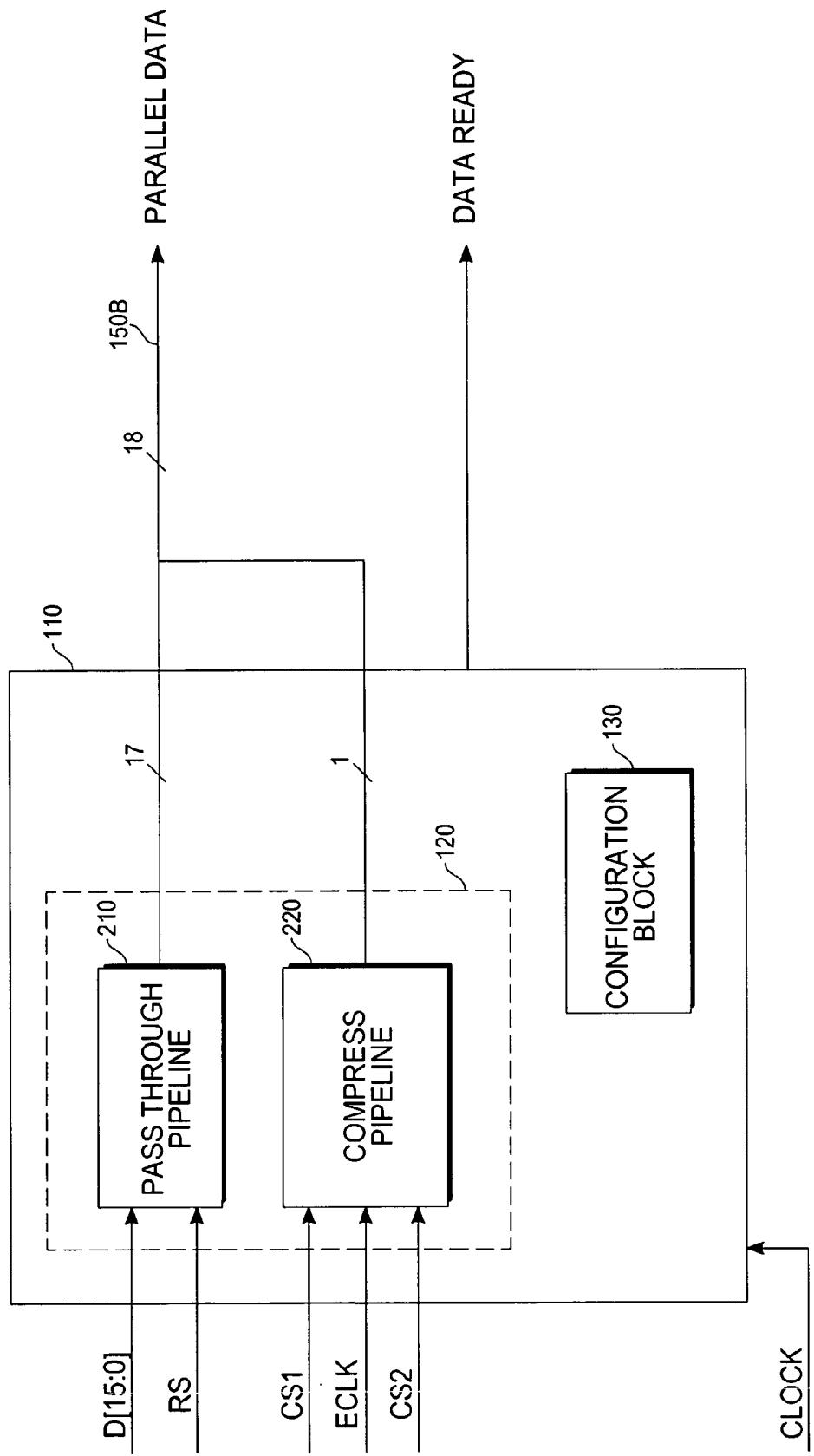
Fig._2a

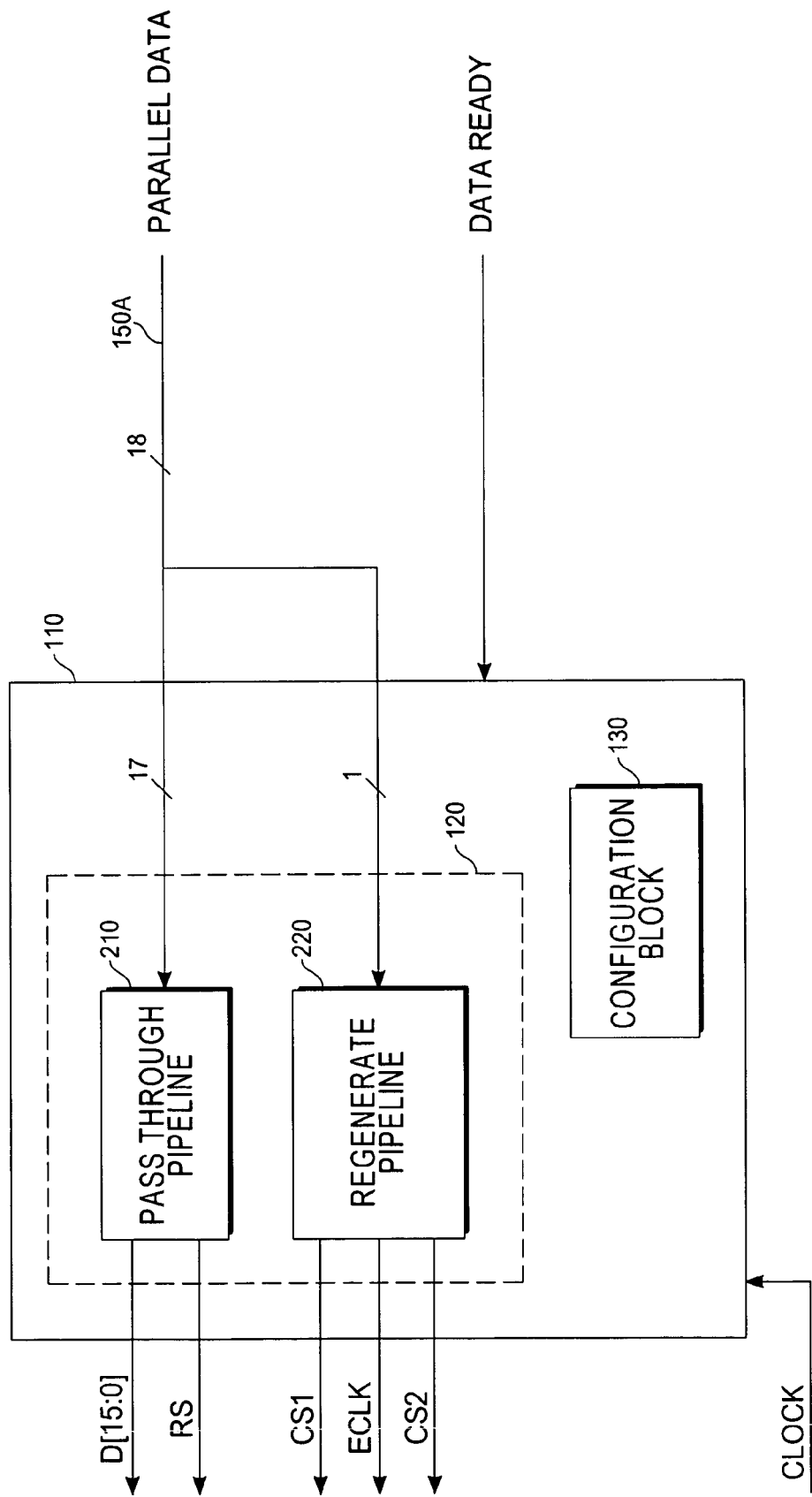
Fig. _2c

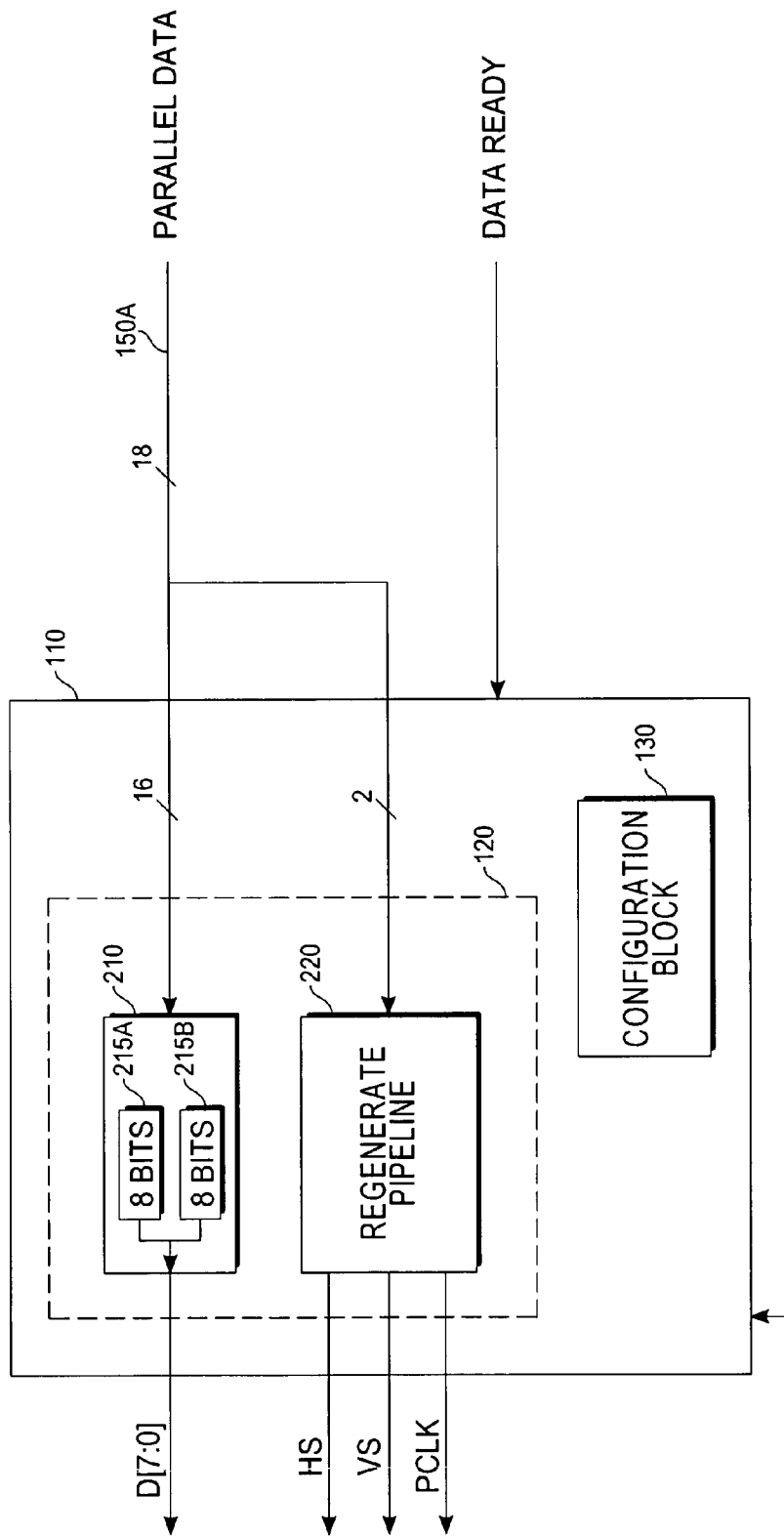
Fig._2d

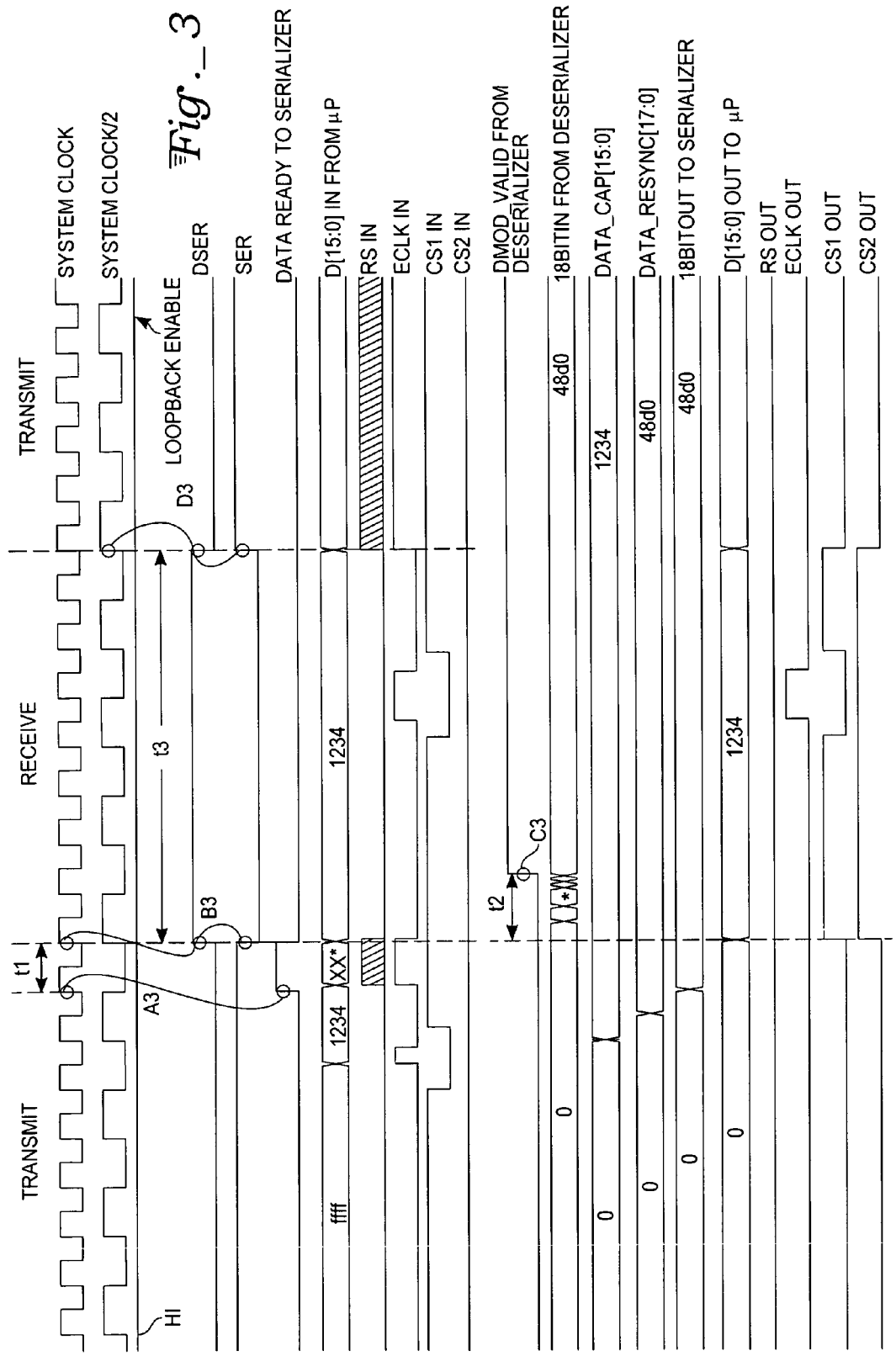
Fig._3

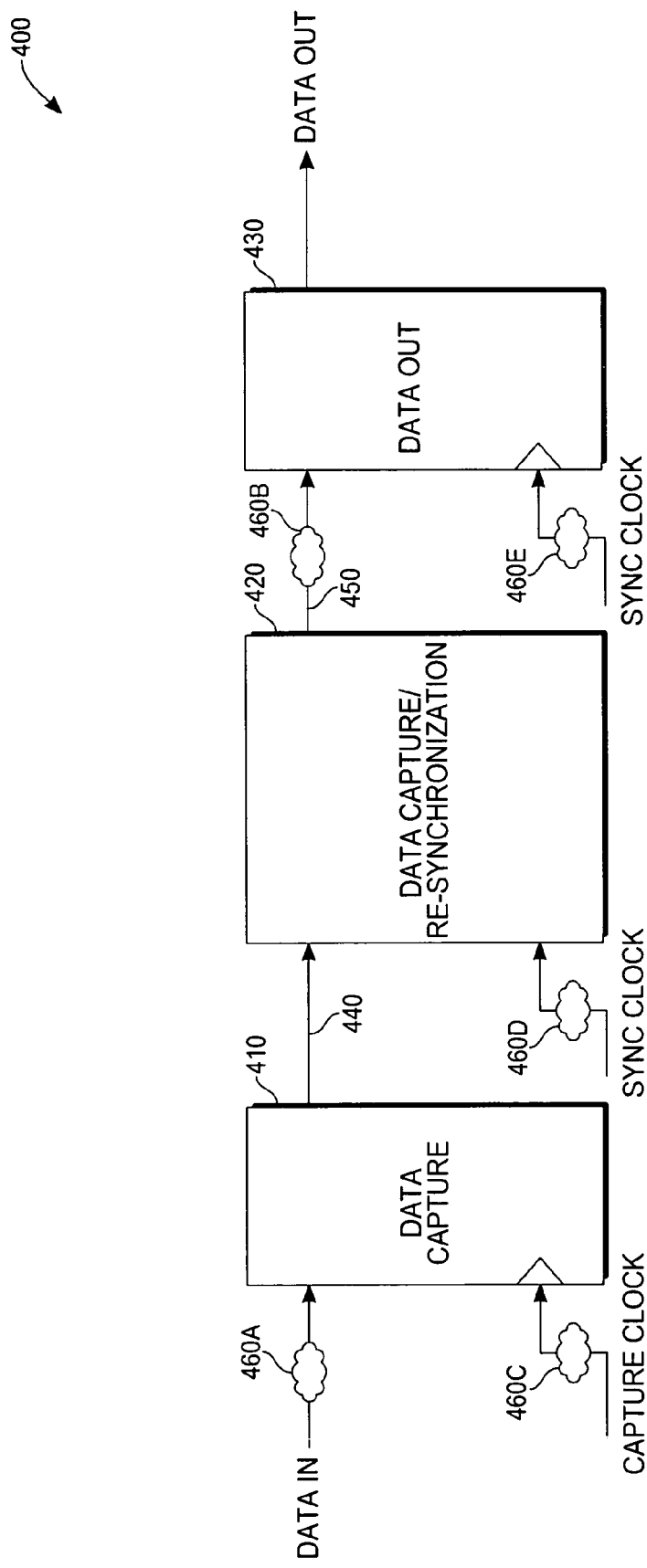
Fig._4

INTERFACE FOR COMPRESSED DATA TRANSFER BETWEEN HOST SYSTEM AND PARALLEL DATA PROCESSING SYSTEM

TECHNICAL FIELD

The present invention is related to integrated circuits. More specifically, the present invention is a system and method for interfacing a number of data, clock, and control lines with a parallel bus.

BACKGROUND ART

Serial interfaces are widely employed for the exchange of digital data between electronic circuits and devices. Some advantages of the serial interface include low pin and wire count for the interconnection medium, low susceptibility to electromagnetic interference (EMI), and low power consumption. A popular application for a serial digital interface (SDI) is the connection of a host computer or processor with an imaging device, a display device such as a Liquid Crystal Display (LCD), or a camera. The SDI provides a means for data exchange between the devices, enabling, for example, the transfer of an image from a camera to a personal computer for sharing, archiving, or modification.

Before data can be shared across a serial link, the data must be formatted into a configuration which matches the particular protocol specifications for the link, and then passed to a serializer modulator circuit. The serializer modulator accepts data in discrete units, typically bytes or words, and translates the data into a series of bits which are conveyed sequentially across the interconnection medium. At the receiving end of the medium, a deserializer demodulator accepts the series of bits and recombines them to recreate the original sequence of data units. The action of the serializer modulator is typically placed under control of a system clock, which determines the rate at which data units are converted by the serializer into a bit sequence and subsequently sent over the interconnection medium. Similarly, the deserializer demodulator accepts the bit sequence at the rate sent by the serializer modulator, and passes the recreated data to the system at a rate controlled by a synchronization clock. In some cases, a clock signal is sent as part of the serial data conveyed by the interface, either embedded within the serialized data, or by means of a separate line dedicated to the clock signal.

The construction of serializer/deserializer (SERDES) circuits is well known in the art. The usual method of interfacing an electronic circuit to the modulator and demodulator circuits within the SERDES is to provide separate interface circuits for a transmit interface and a receive interface. These separate interface circuits each usually communicate with the modulator and demodulator circuits by means of a parallel bus. Furthermore, the interface circuits are typically specific to an intended application. That is, an interface circuit may be designed to convey only 8-bit data or only 16-bit data. In addition, the circuits are usually configured to accommodate a single mode of operation. For example, if the interface is designed to send a clock signal in addition to the data, the circuit cannot be operated without the included clock signal.

It is generally desirable to maximize the performance of a serial interface in terms of bit rate, power consumption, or other performance attributes. One method of achieving this objective is to reduce the number of bits which must be sent over the interface by employing data compression. Often times, data compression is accomplished by software means or by dedicated circuitry to implement a compression algorithm.

What is needed, therefore, is an apparatus and method for interfacing a host circuit to a parallel bus which extends the art by providing both transmit and receive capability, configuration flexibility, and data compression within a single circuit. Additionally, incorporation of data compression enables the possibility of using Return-To-Zero (RTZ) or Return-To-One (RTO) formats for the serial data. This, in turn, opens up a wider range of transmission techniques including Pulse Width Modulation (PWM) and derivatives thereof. In this manner, the usefulness of serial interfaces is enhanced. It will also be appreciated by those skilled in the art that such a capability has other application to data transfer both within and between electronic circuits and devices for example, providing a method of increasing an effective bandwidth of an on-chip parallel bus, while increasing the flexibility and options for interfacing circuit blocks to the parallel bus.

SUMMARY OF THE INVENTION

The invention is an apparatus and method for interfacing a host system having a system data bus, clock signals, and control signals to a parallel data bus. By setting configuration bits the interface apparatus may be programmed to operate as a transmitter or a receiver with selectable device interface modes. When operating as a transmitter, the interface apparatus combines and compresses the system data bus, clocks, and control signals to match the available width of the parallel data bus. When operating as a receiver, the interface receives signals from the parallel data bus and restores the original signals which were combined and compressed. The device interface modes are selectable to be compatible with different device and circuit configurations. In an exemplary embodiment of the invention, the interface apparatus is configured to operate in a microprocessor mode suitable for interfacing a graphical display with a microprocessor, and in an imager mode suitable for interfacing a camera with a microprocessor.

In the discussions which follow, an interface block operating in the transmit mode may also be referred to as a transmit block. Analogously, an interface block operating in the receive mode may also be referred to as a receive block.

BRIEF DESCRIPTION OF THE DRAWINGS

FIG. 1 is a block diagram of a serializer/deserializer system which utilizes the present invention.

FIG. 2a is a block diagram of the present invention configured to transmit data in a microprocessor mode.

FIG. 2c is a block diagram of the present invention configured to receive data in a microprocessor mode.

FIG. 2d is a block diagram of the present invention configured to receive data in an imager mode.

FIG. 3 is a timing diagram illustrating an operating configuration of a loopback mode in accordance with the present invention.

FIG. 4 is a data pass through synchronization pipeline according to an exemplary embodiment of the present invention.

DETAILED DESCRIPTION OF THE INVENTION

Figure 2B:
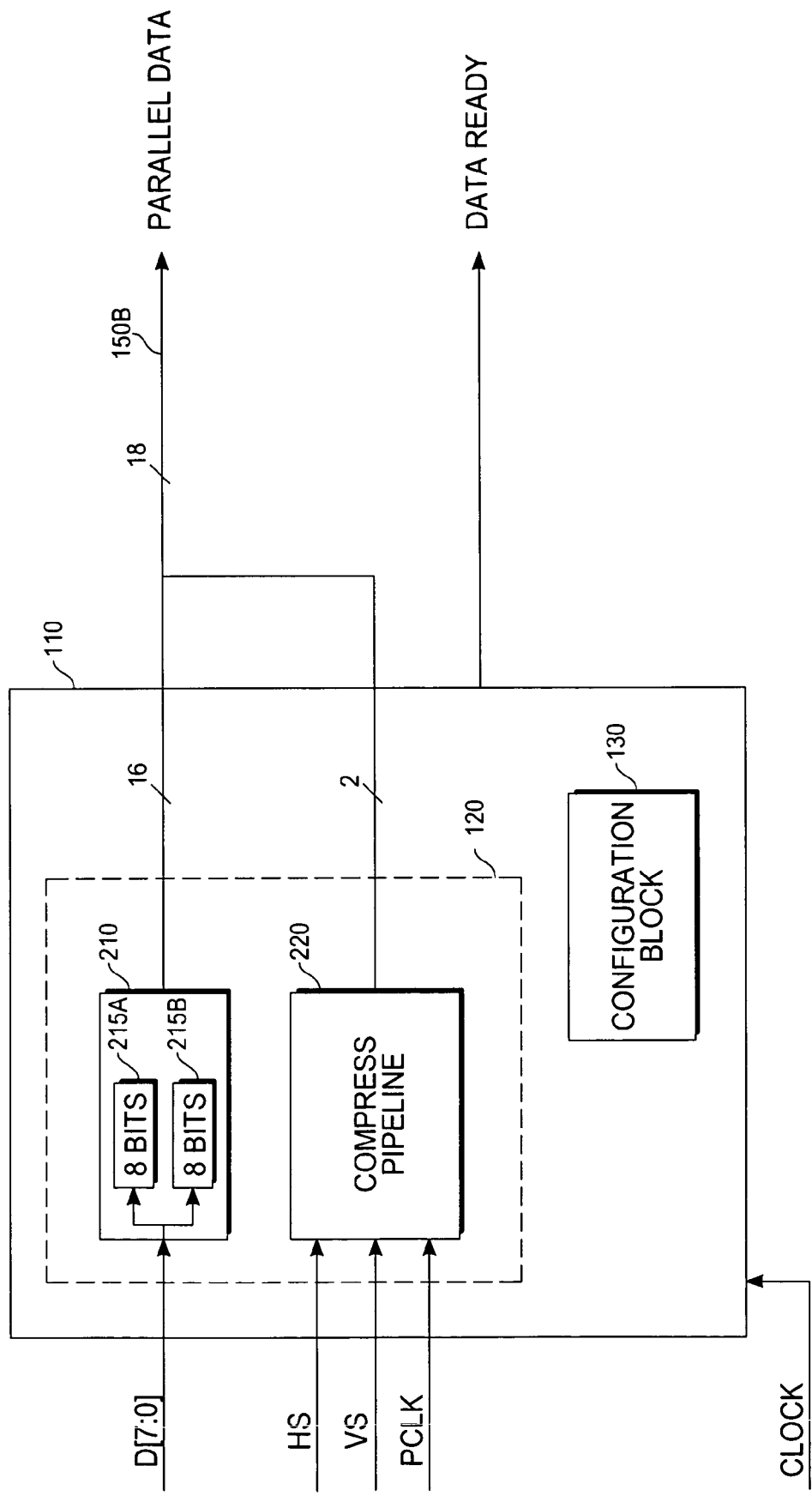
FIG. 2b is a block diagram of the present invention configured to transmit data in an imager mode.

With reference to FIG. 1, a serializer/deserializer system 100 utilizing an exemplary embodiment of the present invention comprises an interface block 110, a clock divider 140, a demodulator 160, and a modulator 170. The interface block 110 is further comprised of a configurable interface 120 and a configuration block 130. Data signals D[15:0] are connected to the interface block 110 and include a data bus which is used as a 16-bit data bus when operating the interface in a microprocessor mode. Alternately, the data signals D[7:0] are used as an 8-bit data bus when operating the interface in an imager mode, with the remaining data signal lines D[15:8] providing a general purpose input/output (GPIO) capability.

A first chip select signal/horizontal sync signal shared line CS1/HS is connected to the configurable interface 120 providing a connection for a first chip select signal CS1 when operating the interface in the microprocessor mode and providing a connection for a horizontal sync signal HS when operating the interface in the imager mode. A second chip select signal CS2 is connected to the configurable interface 120, providing means for sending and receiving the second chip select signal CS2 when operating the interface in the microprocessor mode.

A register select signal/pixel clock signal shared line RS/PCLK is connected to the configurable interface 120 providing a connection for a register select signal RS which is used to distinguish between display data and command data when operating the interface in the microprocessor mode. When operating the interface in the imager mode, the register select signal/pixel clock signal shared line RS/PCLK provides a connection for a pixel clock signal PCLK.

A processor clock signal/vertical sync signal shared line ECLK/VS is connected to the configurable interface 120 providing a connection for a processor clock signal ECLK when operating the interface in the microprocessor mode, and providing a connection for a vertical sync signal VS when operating the interface in the imager mode. A serial clock signal is connected to the configuration block 130. The serial clock signal may be utilized for the capture, resynchronization, or output of the serial data signal. A serial data signal is coupled to the configuration block 130 to provide means for setting and reading configuration bits which set the operating characteristics of the interface.

A system clock signal is connected to the clock divider 140 which divides the system clock frequency by a factor of two in the exemplary embodiment. The divided system clock is connected to the demodulator 160 and the modulator 170. The clock divider 140 is also connected to the serial interface clock signal CTXRX which is sent over the interconnection medium if required by the selected operating mode.

The configurable interface 120 is connected to the demodulator 160 by an input parallel data bus 150A, and to the modulator 170 by an output parallel data bus 150B. In the exemplary embodiment, the input parallel data bus 150A and the output parallel data bus 150B each have a bus width of 18 bits. It will be appreciated by those skilled in the art that it is possible to design a data bus with a bi-directional signaling capability. Thus, in alternate embodiments of the present invention, input parallel data bus 150A and output parallel data bus 150B may share signal lines.

Attention is now directed to FIG. 2a, a block diagram of the interface block 110 configured to transmit data in the microprocessor mode according to the exemplary embodiment of the present invention. The configurable interface 120 further comprises a data synchronize/concatenate block 210 operating in a data pass through pipeline mode, a clock compress and synchronize/regenerate block 220 operating in a clock/control signal compress and synchronize pipeline mode. When the interface block 110 is configured to transmit data in the microprocessor mode, information is received from a microprocessor by means of the data signals D[15:0], the register select signal RS, the first chip select signal CS1, the second chip select signal CS2, and the processor clock signal ECLK, for a total of 20 bits. The received information from the microprocessor is converted to 18-bit parallel data conveyed by the output parallel data bus 150B.

The configuration bits determine whether the interface block 110 is using the processor clock signal (ECLK) or a combination of the first chip select signal (CS1) and the second chip select signal (CS2) as a data capture clock. The configuration bits also determine whether the first chip select signal CS1, the second chip select signal CS2, and the processor clock signal ECLK are active high or active low.

A data capture clock is selected to be either a rising edge or a falling edge of the processor clock signal ECLK, the first chip select signal CS1, or the second chip select signal CS2. Seventeen bits of data comprising data signals D[15:0] and register select signal RS are captured by the data synchronize/concatenate block 210 with the data capture clock, synchronized, and sent to a modulator by the output parallel data bus 150B.

The processor clock signal ECLK, the first chip select signal CS1, and the second chip select signal CS2 are also captured by the clock compress and synchronize/regenerate block 220 with the data capture clock to indicate that valid data are in a synchronization pipeline to be discussed in greater detail with regard to FIG. 4, infra.

When operating in the microprocessor mode, the interface block 110 encodes the first chip select signal CS1, the second chip select signal CS2, and processor clock signal ECLK into one bit of data. The one bit of data indicates which chip select is active. If neither the first chip select signal CS1 nor the second chip select signal CS2 is active, or if there is no active processor clock signal ECLK, then no data are transmitted across the serial link. The processor clock signal ECLK and the first and second chip select signals CS1 and CS2 are regenerated on the receiving unit using the system clock and delay elements, producing timing compatible with the external interface.

The clock compress and synchronize/regenerate block 220 provides an $18^{th}$ bit of data to the output parallel data bus 150B. The $18^{th}$ bit of data is a compression of the processor clock signal ECLK, the first chip select signal CS1, and the second chip select signal CS2. These signals signify the occurrence of a valid data cycle, and further indicate whether the processor is communicating with a first circuit associated with the first chip select signal CS1 or with a second circuit associated with the second chip select signal CS2. Since the processor clock signal ECLK, the first chip select signal CS1, and the second chip select signal CS2 are regenerated by a receive block, the information to be conveyed is which chip select signal is active. This is accomplished by setting the logic level of the $18^{th}$ bit as follows: If the first chip select signal CS1 is active, the $18^{th}$ bit is set low; if the second chip select signal CS2 is active, the $18^{th}$ bit is set high.

A clock signal is connected to the interface block 110 to provide a timing reference for data capture, data synchronization, and data output, to be explained, infra. A data ready signal is coupled to the interface block 110. In the transmit mode, the data ready signal indicates that valid data are present on the output parallel data bus 150B.

Attention is now directed to FIG. 2*b*, a block diagram of the interface block 110 configured to transmit data in the imager mode according to the exemplary embodiment of the present invention. The data synchronize/concatenate block 210 is further comprised of a first data cycle capture block 215A, and a second data cycle capture block 215B, each capable of capturing eight bits of data. When the interface block 110 is configured to transmit data in the imager mode, information is received from an imager by means of the eight data signal lines D[7:0], the horizontal sync signal HS, the vertical sync signal VS, and the pixel clock signal PCLK, for a total of 11 bits per data cycle. Information is captured from the imager in two data cycles and converted to 18-bit parallel data conveyed to a modulator by the output parallel data bus 150B. The capture of two data cycles enables efficient use of the available data bandwidth by exploiting the full 18-bit data path available in microprocessor mode. The data capture clock is configured to be either a rising edge or a falling edge of the pixel clock PCLK. Sixteen bits of data are captured with two successive data capture clocks by the first data cycle capture block 215A and the second data cycle capture block 215B, synchronized, and sent to the modulator.

The horizontal sync signal HS and the vertical sync signal VS are also captured with the data capture clock to indicate that valid data are in the synchronization pipeline (FIG. 4). The horizontal sync signal HS and the vertical sync signal VS are sent once for every two data captures, thereby eliminating two data bits from the data to be sent. The horizontal sync signal HS and the vertical sync signal VS which are sent comprise the $17^{th}$ and $18^{th}$ bits of data on the output parallel data bus 150B. The pixel clock signal PCLK is not sent but instead is regenerated by a receive block. The imager is configured to transfer bursts of data, stopping when the horizontal sync signal HS or the vertical sync signal VS are inactive. The interface block 110 takes advantage of breaks between the horizontal sync signal HS and the vertical sync signal VS: One 18-bit word with the horizontal sync signal HS low and the vertical sync signal VS set to a current value is sent across the link to signify the end of a horizontal sync signal HS burst. Subsequent data are not transferred when the horizontal sync signal HS is low to save power.

Those skilled in the art will appreciate that the principle of capturing successive data cycles can be extended to capture more than two data cycles which may or may not be consecutive and that the output parallel data bus need not be constrained to a width of 18 bits in order to practice the present invention.

Attention is now directed to FIG. 2*c*, a block diagram of the interface block 110 configured to receive data in the microprocessor mode according to the exemplary embodiment of the present invention. In the microprocessor mode of operation, an 18-bit word received from the input parallel data bus 150A is used to recover 20 signals comprising the data signals D[15:0], the register select signal RS, the first chip select signal CS1, the second chip select signal CS2, and the processor clock signal ECLK. In the receive mode, the data ready signal indicates that valid data are present on the input parallel data bus 150A. The data signals D[15:0] and the register select signal RS are recovered by connecting corresponding signals from the input parallel data bus 150A, thereby accounting for 17 of the 18 available signals. The processor clock signal ECLK, the first chip select signal CS1, and the second chip select signal CS2 are recovered by the clock compress and synchronize/regenerate block 220 operating in a regenerate mode using the $18^{th}$ bit from the input parallel data bus 150A. The format of the processor clock signal ECLK, the first chip select signal CS1, and the second chip select signal CS2 after recovery is determined by the configuration bits. Since only one bit is used to represent the processor clock signal ECLK, the first chip select signal CS1, and the second chip select signal CS2 in combination, the signals may be regenerated in a different format than was used to encode the signals in the transmit block. The setup and hold timing of the processor clock signal ECLK, the first chip select signal CS1, and the second chip select signal CS2 with relation to each other and to the data signals D[15:0] and with relation to the register select signal RS is recreated to be compatible with a destination microprocessor attached to the interface block 110.

Attention is now directed to FIG. 2*d*, a block diagram of the interface block 110 configured to receive data in the imager mode according to the exemplary embodiment of the present invention. In the imager mode of operation, an 18-bit word received from the input parallel data bus 150A is used to recover the signals comprising two sequential imager cycles of eight data signals D[7:0], the vertical sync signal VS, the horizontal sync signal HS, and the pixel clock signal PCLK, for a total of 22 bits of original data. The data signals D[7:0] are recovered by the data pass through/concatenate block 210 by storing 16 bits from the input parallel data bus 150A corresponding to the desired data and transferring the stored bits out of the data synchronize/concatenate block 210 in two consecutive groups of eight bits. The clock compress and synchronize/regenerate block 220 recovers the vertical sync signal VS, the horizontal sync signal HS, and the pixel clock signal PCLK. The $17^{th}$ and $18^{th}$ bits from the input parallel data bus 150A are used to recover the vertical sync signal VS and the horizontal sync signal HS. The pixel clock signal PCLK is regenerated using the system clock. The polarity of the vertical sync signal VS, the horizontal sync signal HS, and the pixel clock signal PCLK are determined by the configuration bits. Since the pixel clock signal PCLK is regenerated in the clock compress and synchronize/regenerate block 220, its polarity and behavior, e.g., continuous or burst operation, may be different than employed at the transmit block.

Attention is now directed to FIG. 3, a timing diagram illustrating the relationship between signals when the present invention is operating in a loopback mode commonly employed for the purpose of self-testing. The loopback mode illustrated corresponds to the system configured in the microprocessor mode of operation. The timing diagram is the product of a simulation of the internal logic of the serializer/deserializer system 100 (FIG. 1). The simulation was performed with commercial logic simulators known as Verilog®-NC and Verilog®-XL and manufactured by Cadence Design Systems, Inc., San Jose, Calif., USA. Data values are presented in FIG. 3 in hexadecimal notation. According to common practice known to those skilled in the art, an "X" indicates an unknown value. An asterisk "*" indicates the existence of a known value with insufficient space on the graphical display to represent the number. A hatch pattern "\\\" indicates a binary (single bit) signal with an unknown value.

The top of the timing chart in FIG. 3 shows the system clock (FIG. 1) and the divided system clock (system clock/2). A signal LOOPBACK ENABLE shows the state of a loopback configuration bit. When LOOPBACK ENABLE is asserted HI (logic high) as shown in FIG. 3, the interface block 110 automatically switches from the transmit mode to the receive mode and back for on-chip loopback testing.

In on-chip loopback testing, the interface block 110 switches from transmit to receive mode one serial clock cycle after it raises the data ready signal (FIGS. 2A-D) and remains in receive mode for four system clock cycles: At event A3 in FIG. 3, the data ready signal is observed to transition from logic low to high approximately concurrent with a rising edge of the serial clock. Signals D[15:0] IN, which represent the data signals D[15:0] FIG. 2a) operating in the input mode, are latched by a data capture register to be discussed in greater detail with regard to FIG. 4, infra. The data capture process is initiated by input signals ECLK, CS1, or CS2 when the interface is in the transmit mode. In the example shown the value associated with the signals D[15:0] IN at the time of capture is hexadecimal 0×1234; in 16-bit binary notation this value is 0001001000111000. The captured data appear as signal DATA_CAP[15:0], and are observed to equal the hexadecimal value 0×1234 after event A3 occurs. After the data are captured they are resynchronized and converted to an 18-bit number by appending RS and a combined ECLK, CS1, and CS2 signal. The resynchronized data appear in FIG. 3 as the signal DATA_R-ESYNC[17:0] with hexadecimal value 0×48d0, corresponding to the 18-bit binary number 000100100011100000. The resynchronized data are passed to a data output register to be discussed in greater detail with regard to FIG. 4, infra. The data appear as signal 18BITOUT which corresponds to the parallel data signal in FIG. 2A. The data from the signal 18BITOUT are sent to the modulator 170 (FIG. 1) by means of the output parallel data bus 150B (FIGS. 1, 2A) and subsequently looped back to the demodulator 160 (FIG. 1). The DATA READY signal indicates that the 18-bit data are ready for the serializer block.

After a time period t1, corresponding to one serial clock cycle, event B3 occurs. At event B3 a deserializer function control signal DSER transitions from low to high. Concurrently, a serializer function control signal SER transitions from high to low. The changes in the deserializer function control signal DSER and the serializer function control signal SER transition the interface block 110 from the transmit mode to the receive mode.

During a time period t2, the demodulator 160 (FIG. 1) deserializes the loopback data. An event C3 signals the completion of this operation by transitioning a signal DMOD_VALID from low to high. The event C3 indicates the presence of valid data on the input parallel data bus 150A (FIGS. 1, 2C) as represented by the signal 18BITIN. Reference to FIG. 3 and 18BITIN shows that the data value after the event C3 is hexadecimal 0×48d0, corresponding to the loopback data provided to the modulator 160 (FIG. 1). The two least significant bits are stripped from the data and used to recreate RS, ECLK, CS1, and CS2. The remaining sixteen bits comprise the signal D[15:0] OUT, which represent the data signals D[15:0] (FIG. 2c) operating in the output mode. Reference to FIG. 3 shows that the signal D[15:0] OUT has the value of hexadecimal 1234 during the period of operation corresponding to the receive mode, illustrating correct recovery of the original data.

It is to be noted that during the receive interval identified in FIG. 3, the signals ECLK IN and ECLK OUT appear similar. During this portion of the loopback mode, the signals ECLK IN and ECLK OUT are tied together at a pad. During the transmit intervals identified in FIG. 3, the signals ECLK IN and ECLK OUT may differ, while the system is in a serialization mode and receiving data to the microprocessor.

The receive mode persists for the time period t3 shown in FIG. 3, corresponding to four system clock cycles, as described supra. At the end of the time period t3, an event D3 occurs. At the event D3 the deserializer function control signal DSER transitions from high to low. Concurrently, the serializer function control signal SER transitions from low to high. The changes in the deserializer function control signal DSER and the serializer function control signal SER transition the interface block 110 from the receive mode to the transmit mode.

A unique aspect to the loopback configuration is the use of the same registers for both transmit and receive modes. In loopback designs known in the prior art, transmit and receive paths are activated simultaneously; thus, separate registers are employed for the transmit and the receive functions.

With reference to FIG. 4, an exemplary three stage data pass through synchronization pipeline 400 is an alternative conceptual view of the configurable interface 120 (FIG. 1) which includes a data capture register 410, a data capture/resynchronization register 420, a data out register 430, a data capture signal line 440, a data capture/resynchronization signal line 450, and intervening logic blocks 460A-E. The data capture/resynchronization register 420 is connected to the data capture register 410 and to the data out register 430. A pipeline data in signal is connected to the data capture register 410 and conveys a plurality of input signals to the data capture register 410 which latches the input signals on an edge of a capture clock signal. The latched input signals are later clocked out of the data capture register on a subsequent edge of the capture clock signal and conveyed by the data capture signal line 440 to an input of the data capture/resynchronization register 420. The signals applied to the input of the data capture/resynchronization register 420 are latched on an edge of a sync clock signal, and later clocked out on a subsequent edge of the sync clock signal and conveyed by the data capture/resynchronization signal line 450 to an input of the data out register 430. The signals applied to the input of the data out register 430 are latched on an edge of the sync clock signal, and later clocked out on a subsequent edge of the sync clock signal, forming a pipeline data out signal. To save implementation area for the interface block 110 (FIGS. 1, 2A-2D) on a silicon die, the same three stage data pass through synchronization pipeline 400 is employed for all operating modes of the interface. When operating the interface block 110 in imager mode, the three stage data pass through synchronization pipeline 400 is also used for regeneration of the horizontal sync signal HS, the vertical sync signal VS, and the pixel clock signal PCLK. When operating the interface block 110 in the microprocessor mode, the three stage data pass through synchronization pipeline 400 is also used for regeneration of the first chip select signal CS1, the second chip select signal CS2, and processor clock signal ECLK. Skilled artisans will appreciate that the data capture register 410, the data capture/resynchronization register 420, and the data out register 430 may each be comprised further of multiple registers according to the number of data signals which are processed, the illustration of each as a single register being a simplification to demonstrate the essential elements of the present invention without obscuration. It is to be further appreciated that the intervening logic blocks 460A-E represent the potential incorporation of logic circuits and functions commonly employed to facilitate the distribution and control of signals in a digital circuit.

Appropriate selection of the capture clock signal and the sync clock signal enable the interface block 110 to recover the signals which are not sent over serial link. The following table summarizes the relationship between the operating mode, signals, and clocks employed by the exemplary embodiment of the present invention:

| Operating Mode | Pipeline Data In Signals | Capture Clock | Pipeline Data Out Signals | Sync Clock |
|---|---|---|---|---|
| Microprocessor Transmit | D[15:0], RS, CS1, CS2, ECLK | CS1, CS2, or ECLK | 18 bits to the output parallel data bus 150B | System clock |
| Microprocessor Receive | 18 bits from the input parallel data bus 150A | From demodulator 160 | D[15:0], RS, CS1, CS2, ECLK | System clock |
| Imager Transmit | D[7:0], VS, HS | PCLK | 18 bits to the output parallel data bus 150B | System clock |
| Imager Receive | 18 bits from the input parallel data bus 150A | From demodulator 160 | D[7:0], VS, HS | Regenerated PCLK |

In the exemplary embodiment, the data cycles from the microprocessor are asynchronous to the system clock, but may be received at the same frequency as the system clock. The data cycles from the imager interface are also asynchronous to the system clock, but may be received at twice the frequency of the system clock. The interface block 110 captures the data and synchronizes it to the system clock transferring it to the modulator 170 (FIG. 1). To enable the synchronization, the system clock may be doubled and the doubled system clock is used for the synchronization pipeline. Eighteen bits of data are sent to the transmit block with a synchronous signal that indicates the data are ready.

When the interface block 110 is in the receiving mode, it is assumed that the data are received asynchronously to the system clock. Because of the delay from the transmit block, the delay of the data link, and the asynchronous nature of the receive block, the 18-bit parallel data are assumed to be asynchronous to the system clock, but may be received at the same frequency as the system clock. The phase relationship of the received data and the system clock is indeterminate. The interface block captures the 18-bit data once per system clock cycle and synchronizes it to the system clock before regenerating the encoded signals which were not sent explicitly over the link. To enable the synchronization, the system clock may be doubled for use with the synchronization pipeline.

Figure 5:
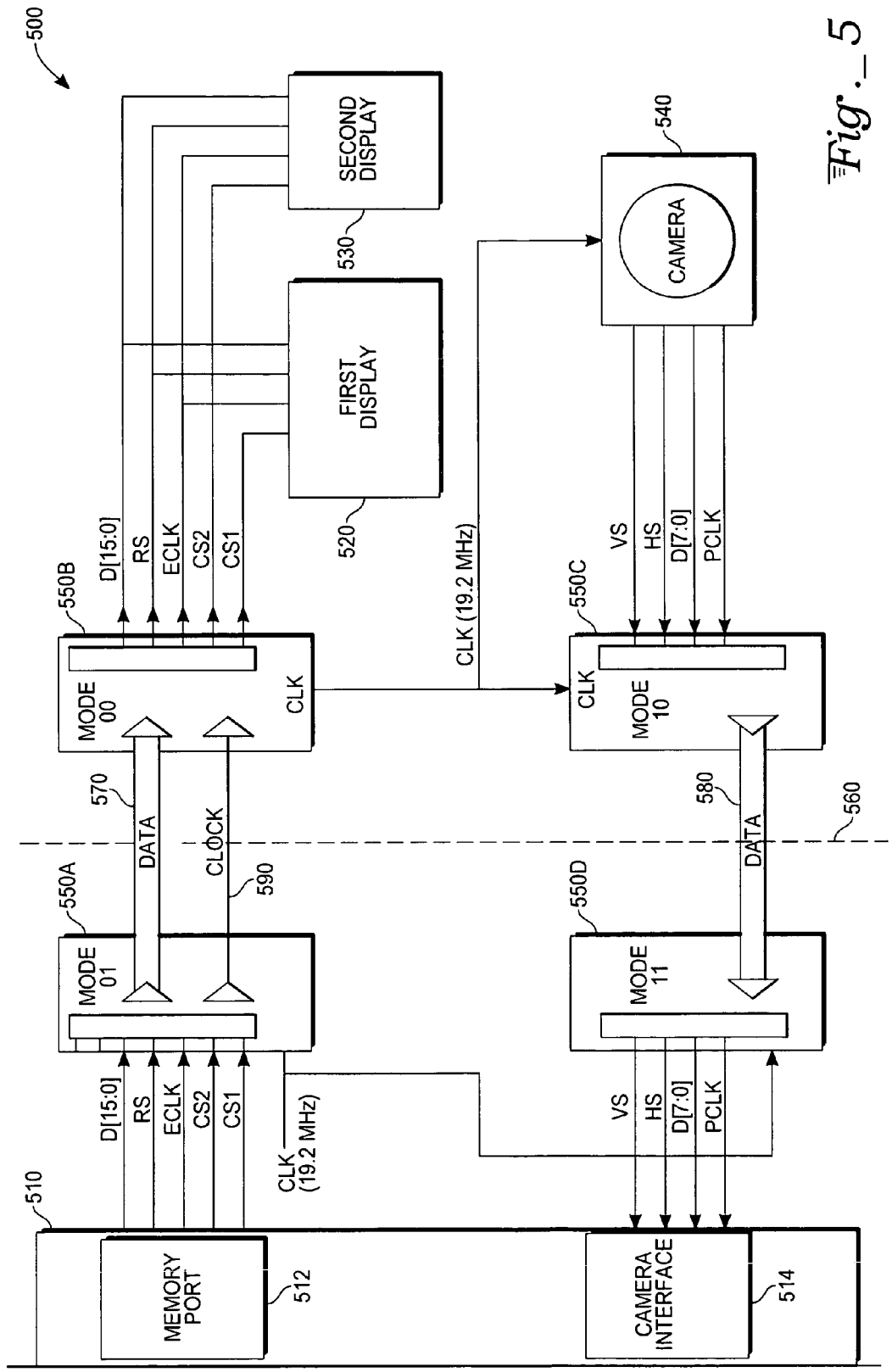
FIG. 5 is a block diagram of a microprocessor system which utilizes the present invention.

Attention is now directed to FIG. 5, a microprocessor system 500 according to the exemplary embodiment of the present invention further including a microprocessor 510, a first display 520, a second display 530, a camera 540, and a first, second, third, and fourth instance of a serializer/deserializer 550A-D. The first, second, third, and fourth instance of the serializer/deserializer 550A-D are specific embodiments of the serializer/deserializer system 100 (FIG. 1). The microprocessor 510 further includes a memory port 512 for supplying display data and a camera interface 514 for receiving image data. A clock signal line CLK conveying a system clock operating at, for example, 19.2 MHz is coupled to the instances of the serializer/deserializer 550A-D and to the camera 540.

A mode number appearing in association with each instance of the serializer/deserializer 550A-D indicates the operating configuration, according to the following table:
Mode 00: microprocessor mode, receive
Mode 01: microprocessor mode, transmit
Mode 10: imager mode, transmit
Mode 11: imager mode, receive A conceptual boundary 560 separates the microprocessor system 500 into two portions: a first portion devoted to data processing comprising the microprocessor 510, and a second portion devoted to image acquisition and display, comprising the first display 520, the second display 530, and the camera 540. The two portions separated by the conceptual boundary 560 are linked by microprocessor serial data lines 570, imager serial data lines 580, and clock line 590 connecting the instances of the serializer/deserializer 550A-D. It will be appreciated by those skilled in the art that the two portions of the imaging system may be physically separate and distinct devices, for example a personal computer linked to an image display and capture unit by a serial cable, or the two portions of the imaging system may be integrated on a single circuit board, a single package module, or even a single semiconductor substrate.

It is to be further appreciated by those skilled in the art that an alternative embodiment can be constructed in which clock line 590 is rendered unnecessary by embedding the clock signal in the transmitted serial data originating in the first instance of the serializer/deserializer 550A and recovering the clock signal from the received serial data in the second instance of the serializer/deserializer 550B.

A transmit block and a receive block linked by a serial interconnection are usually both configured by the appropriate configuration bits to operate in the same device interface mode; i.e., the microprocessor mode or the imager mode. All other configuration bits may be set differently on the transmit block and the receive block. For example, the transmit block in the first instance of the serializer/deserializer 550A may be configured to interface in the microprocessor mode using an ECLK write mode, active high. The corresponding receive block in the second instance of the serializer/deserializer 550B may be configured to interface in the microprocessor mode using a CS write mode, active low. The capability to vary configuration bit settings between the transmit block and the receive block allows for flexibility in choosing how devices connect to the blocks.

The memory port 512 of the microprocessor 510 is connected to the first instance of the serializer/deserializer 550A by the data signal lines D[15:0], the register select signal RS, the first chip select signal CS1, the second chip select signal CS2, and the processor clock signal ECLK. The second instance of the serializer/deserializer 550B is connected to the first display by the data signal lines D[15:0], the register select signal RS, the first chip select signal CS1, and the processor clock signal ECLK. The second instance of the serializer/deserializer 550B is connected to the second display by the data signal lines D[15:0], the register select signal RS, the second chip select signal CS2, and the processor clock signal ECLK. The first instance of the serializer/deserializer 550A and the second instances of the serializer/deserializer 550B are connected across the conceptual boundary 560 by the microprocessor serial data lines 570 and the clock line 590.

The camera 540 is connected to the third instance of the serializer/deserializer 550C by the vertical sync signal VS, the horizontal signal HS, data signals D[7:0], and the pixel clock PCLK. The third instance of serializer/deserializer 550C is connected across the conceptual boundary 560 to the fourth instance of the serializer/deserializer 550D by the imager serial data lines 580. The fourth instance of the serializer/deserializer 550D is coupled to the camera interface 514 of microprocessor 510 by the horizontal sync signal HS, the vertical sync signal VS, data signals D[7:0], and the pixel clock PCLK.

The following tables summarize the signals sent across the conceptual boundary 560 by the serial links and whether the signals are explicitly sent or are regenerated the second instance of the serializer/deserializer 550B for the microprocessor link and the fourth instance of the serializer/deserializer 550D for the imager link.

Imager Link

| Signal Name | Sent (S) or Regenerated (R) | Description |
|---|---|---|
| D[7:0] | S | 8-bit data bus |
| VS | S | Vertical sync |
| HS | S | Horizontal sync |
| PCLK | R | Pixel clock (19.2 MHz) |

Microprocessor Link

| Signal Name | Sent (S) or Regenerated (R) | Description |
|---|---|---|
| D[15:0] | S | 16-bit data bus |
| RS | S | Register select: distinguishes display and command data |
| CS1 | S | Chip select for first display |
| CS2 | R | Chip select for second display |
| ECLK | R | Processor clock |

The interface block 100 (FIGS. 1, 2A-D) is highly configurable, allowing the microprocessor system 500 to connect multiple microprocessor and imager interfaces. The configuration allows the polarity of each interfaced signal to be inverted and also allows the format of the microprocessor control signals to be changed.

In the transmit mode, the interface block 110 (FIG. 1) accepts data in the imager mode from the 8-bits of data signals D[7:0], by the vertical sync signal VS, the horizontal signal HS, and the pixel clock PCLK connected to the third instance of serializer/deserializer 550C, and accepts data in the microprocessor mode from the data signal lines D[15:0], the register select signal RS, the first chip select signal CS1, the second chip select signal CS2, and the processor clock signal ECLK connected to serializer/deserializer 550A. The signals accepted by the first instance of the serializer/deserializer 550A and the third instance of the serializer/deserializer 550C are serialized 18 bits at a time. The interface block 110 (FIGS. 1, 2B) within the third instance of the serializer/deserializer 550C, combines the data from two data transfers and reduces the total number of bits from 22 to 18 with no loss of information. The interface block 110 (FIGS. 1, 2A) within the first instance of the serializer/deserializer 550A reduces the number of signals from 20 to 18 with no loss of information.

The interface block 110 translates the 20 input signals in the microprocessor mode or the two blocks of eleven input signals in the imager mode into an 18-bit word to be transmitted, thereby compressing the signals before transmission. The control signals and data are encoded such that the information can be regenerated on the receiving system. The encoding allows the control signals and data to be regenerated into another format on the receiving system with no additional circuitry.

In the foregoing specification, the invention has been described with reference to specific embodiments thereof. It will, however, be evident to a skilled artisan that various modifications and changes can be made thereto without departing from the broader spirit and scope of the invention as set forth in the appended claims. For example, the specific number and function of the input signals, the width of the output bus, and the choice of signals to be compressed, regenerated, or explicitly conveyed may all be varied within the present invention. The specification and drawings are, accordingly, to be regarded in an illustrative rather than a restrictive sense.

What is claimed is:

1. An interface circuit providing parallel data to a serializer/deserializer modulator and receiving parallel data from a serializer/deserializer demodulator, the interface circuit comprising:

a parallel data bus for sending and receiving compressed data, the parallel data bus having a parallel data bus width;

a plurality of data lines and signal lines from at least one of the following groups including: a first group of at least one clock line and a second group of at least one control line for interfacing with a host system, the data lines comprising a host data bus having a host data bus width;

a concatenation block capable of receiving multiple data cycles from the host data bus and combining into parallel data; and a configuration block to accept one or more configuration bits which configure the interface circuit to operate as a receive device for receiving data from the parallel data bus.

2. An interface circuit providing parallel data to a serializer/deserializer modulator and receiving parallel data from a serializer/deserializer demodulator, the interface circuit comprising:

a parallel data bus for sending and receiving compressed data, the parallel data bus having a parallel data bus width;

a plurality of data lines and signal lines from at least one of the following groups including: a first group of at least one clock line and a second group of at least one control line for interfacing with a host system, the data lines comprising a host data bus having a host data bus width;

a concatenation block capable of receiving multiple data cycles from the host data bus and combining into parallel data; and a configuration block to accept one or more configuration bits which configure the interface circuit to reconstruct one or more signals from the group comprising clock and control signals in one or more of a plurality of protocols comprising positive and negative logic polarity and continuous and discontinuous operation.

3. An interface circuit providing parallel data to a serializer/deserializer modulator and receiving parallel data from a serializer/deserializer demodulator, the interface circuit comprising:
    a parallel data bus for sending and receiving compressed data, the parallel data bus having a parallel data bus width;
    a plurality of data lines and signal lines from at least one of the following groups including: a first group of at least one clock line and a second group of at least one control line for interfacing with a host system, the data lines comprising a host data bus having a host data bus width;
    a concatenation block capable of receiving multiple data cycles from the host data bus and combining into parallel data;
    a clock recovery/clock compression block;
    a data capture register bank;
    a data resynchronization register bank; and
    a data output register bank.

4. The interface circuit of claim 3, wherein the combined number of the data lines, clock lines, and control lines exceeds the parallel data bus width.

5. The interface circuit of claim 3, wherein the parallel data bus width is 18 bits.

6. The interface circuit of claim 5, wherein the host data bus width is 16 bits.

7. The interface circuit of claim 5, wherein the host data bus width is 8 bits.

8. The interface circuit of claim 3, further comprising a configuration block to accept one or more configuration bits which configure the interface circuit to operate as a transmit device for sending data to the parallel data bus.

9. A method of interfacing a host system having a host system data bus, clock lines, and control lines with a parallel data bus having a parallel data bus width, the method comprising:
    setting a plurality of configuration bits to indicate an interface operation as having either a transmit mode or a receive mode;
    using the configuration bits to further set a host system data bus width; and
    when operating in the transmit mode, combining and compressing the host system data bus signals and signals from at least one of the following groups including: a first group of at least one clock signal and a second group of at least one control signal to match the parallel data bus width; and
    transmitting the combined and compressed signals to the parallel data bus; and
    when operating in the receive mode, receiving a combined and compressed set of signals from the parallel data bus and restoring the host system data bus signals and signals from at least one of the following groups including: a first group of at least one clock signal and a second group of at least one control signal by decompression and clock recovery.

10. The method of claim 1, wherein the method of combining and compressing the host system data bus signals and the one or more of the following groups including one or more clock signals and one or more control signals further comprises:
    combining the host system data bus signals and an address signal to result in a pass-through signal having a pass-through data width equal to a combined value of the host system data bus width and an address signal width;
    compressing the one or more of the following groups including: one or more clock signals and one or more control signals by selecting a capture clock signal from either a rising edge or a falling edge of a first chip select signal, a second chip select signal, or a host clock signal on the basis of the setting of one or more of the plurality of the configuration bits; and
    combining the capture clock signal with the pass-through signal.

11. The method of claim 1, wherein the method of combining and compressing the host system data bus signals and the one or more of the following groups including one or more clock signals and one or more control signals further comprises:
    capturing, on one or more edges of a data capture clock, multiple data cycles from the host system data bus and concatenating the data cycles to produce a concatenated data signal having a concatenated data width equal to the number of data cycles captured multiplied by the host system data bus width;
    capturing a first synchronization signal on a first selected edge of the data capture clock;
    capturing a second synchronization signal on a second selected edge of the data capture clock; and
    combining the concatenated data signal with the first and the second captured synchronization signals.

12. The method of claim 1, wherein the method of restoring the host system data bus signals and the one or more of the following groups including one or more clock signals and one or more control signals by decompression and clock recovery comprises:
    selecting and separating the host system data bus signals and an address signal from a pass-through signal received from the parallel data bus; and
    regenerating a first chip select signal, a second chip select signal, and a host clock signal from a capture clock signal received from the parallel data bus;
    using the logic state of the capture clock signal to determine which of the first or the second chip select signals is active; and
    using a system clock signal to synchronize the host clock signal.

13. The method of claim 1, wherein the method of restoring the host system data bus signals and the one or more of the following groups including one or more clock signals and one or more control signals by decompression and clock recovery comprises:
    selecting a first plurality of signals from the parallel data bus corresponding to a concatenated signal having a concatenated data width equal to a number of concatenated data cycles multiplied by the host system data bus width;
    sending the selected plurality of signals in a series of multiple data cycles, such that each data cycle sends a portion of the concatenated signal equal to the host system data bus width, the cycles repeating until the all portions of the concatenated signal have been sent;
    selecting a second plurality of signals from the parallel data bus corresponding to a first captured synchronization signal and a second captured synchronization signal; and
    passing the first and second captured synchronization signals through a register clocked by a system clock so as to recreate a first and a second synchronization signal with an associated data clock, the polarity of the first and second synchronization signals and the associated data clock signal being determined by the plurality of configuration bits.

14. An interface circuit providing parallel data to a serializer/deserializer modulator and receiving parallel data from a serializer/deserializer demodulator, the interface circuit comprising:

means for sending and receiving data on a parallel bus having a parallel bus width;

interfacing means for communicating with a host system, the interfacing means having a plurality of data lines and one or more of the following groups including: one or more clock lines and one or more control lines;

means for receiving multiple data cycles from the host system and concatenating the multiple data cycles into parallel data;

means for data resynchronization; and means for clock signal compression and recovery.

15. The interface circuit of claim 14, further comprising means for data compression to enable the combined number of the data lines, clock lines, and control lines to exceed the parallel bus width.

16. The interface circuit of claim 15, wherein the parallel bus width is 18 bits.

17. The interface circuit of claim 15, wherein the interfacing means comprises 16 data lines.

18. The interface circuit of claim 15, wherein the interfacing means comprises 8 data lines.

19. The interface circuit of claim 14, further comprising configuration means to accept one or more configuration bits which configure the interface circuit to operate as a transmit device for sending data to the parallel bus or as a receive device for receiving data from the parallel bus.

* * * * *